United States Patent
Yang et al.

(10) Patent No.: US 10,891,884 B1
(45) Date of Patent: Jan. 12, 2021

(54) TEST-RESPONSE COMPARISON CIRCUIT AND SCAN DATA TRANSFER SCHEME IN A DFT ARCHITECTURE FOR MICRO LED BASED DISPLAY PANELS

(71) Applicant: Apple Inc., Cupertino, CA (US)

(72) Inventors: Bo Yang, Santa Clara, CA (US); Xiang Lu, Campbell, CA (US); Andrew J. Copperhall, Redwood City, CA (US); Henry C. Jen, Los Altos, CA (US); Karthik Manickam, Santa Clara, CA (US); Sagar Nataraj, San Jose, CA (US); Shriram Vijayakumar, Santa Clara, CA (US); Derek K. Shaeffer, Redwood City, CA (US)

(73) Assignee: Apple Inc., Cupertino, CA (US)

(*) Notice: Subject to any disclaimer, the term of this patent is extended or adjusted under 35 U.S.C. 154(b) by 50 days.

(21) Appl. No.: 16/281,996

(22) Filed: Feb. 21, 2019

Related U.S. Application Data

(60) Provisional application No. 62/684,911, filed on Jun. 14, 2018.

(51) Int. Cl.
| | |
|---|---|
| *G09G 3/00* | (2006.01) |
| *G09G 3/32* | (2016.01) |
| *G01R 31/3185* | (2006.01) |
| *G01R 31/317* | (2006.01) |
| *G01R 31/58* | (2020.01) |

(52) U.S. Cl.
CPC ....... *G09G 3/006* (2013.01); *G01R 31/31704* (2013.01); *G01R 31/318583* (2013.01); *G01R 31/58* (2020.01); *G09G 3/32* (2013.01); *G09G 2310/0283* (2013.01); *G09G 2330/12* (2013.01)

(58) Field of Classification Search
CPC ... G09G 3/006; G09G 3/32; G01R 31/318583
USPC ..................................... 324/762.02
See application file for complete search history.

(56) References Cited

U.S. PATENT DOCUMENTS

| | | | |
|---|---|---|---|
| 8,994,380 B2 | 3/2015 | Yun et al. | |
| 9,191,663 B2 | 11/2015 | Kwak | |
| 9,780,779 B2* | 10/2017 | Sato | G09G 5/003 |
| 9,930,277 B2* | 3/2018 | Cok | H04N 5/376 |
| 10,200,059 B2* | 2/2019 | Cagdaser | H03M 1/785 |
| 2005/0264472 A1* | 12/2005 | Rast | G09G 3/14 345/30 |
| 2018/0090059 A1 | 3/2018 | Baroughi et al. | |

OTHER PUBLICATIONS

Yang, Bo, et al. "A clock-gating based capture power droop reduction methodology for at-speed scan testing." 2011 Design, Automation & Test in Europe. IEEE, 2011, 7 pgs. total.

* cited by examiner

*Primary Examiner* — Reena Aurora
(74) *Attorney, Agent, or Firm* — Jaffery Watson Mendonsa & Hamilton LLP

(57) ABSTRACT

Design-for-test (DFT) architectures, and methods of testing an array of chips, which may be identical, are described. In an embodiment, a comparison circuit includes a plurality of comparators to compare scan-data out (SDO) data streams with an expected data stream and transmit a compared data stream that is indicated of whether or not an error exists in any of the SDO data streams.

19 Claims, 8 Drawing Sheets

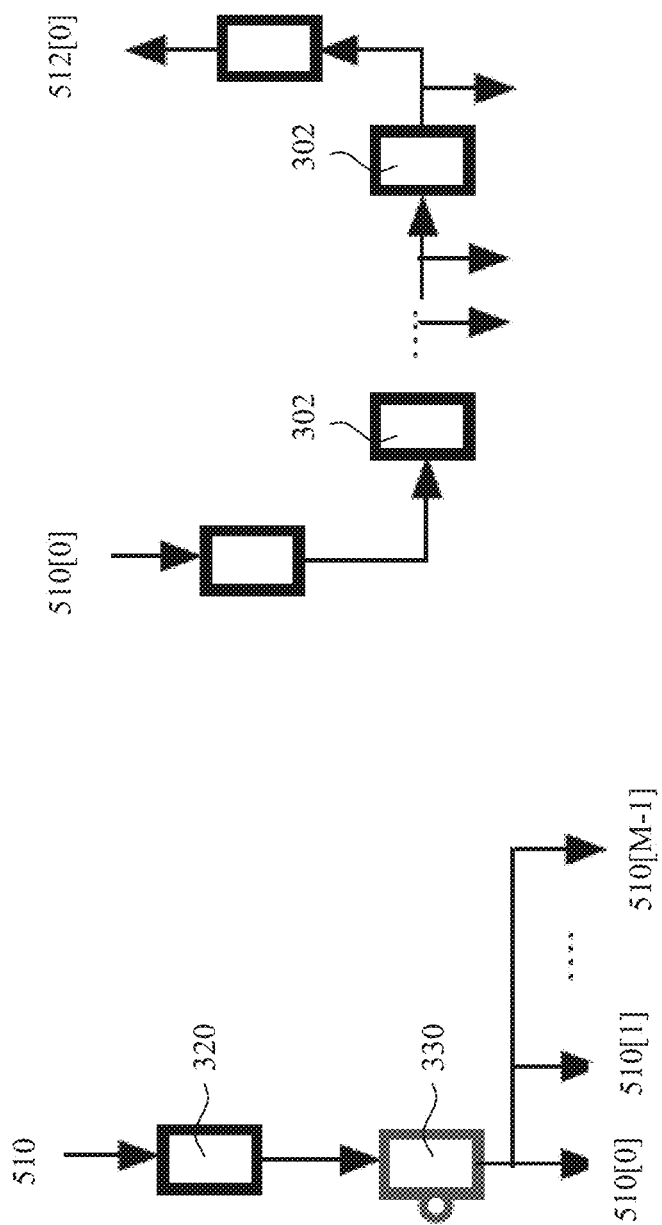

TEST-RESPONSE COMPARISON CIRCUIT AND SCAN DATA TRANSFER SCHEME IN A DFT ARCHITECTURE FOR MICRO LED BASED DISPLAY PANELS

RELATED APPLICATIONS

This application claims the benefit of priority of U.S. Provisional Application No. 62/684,911 filed Jun. 14, 2018 which is incorporated herein by reference.

BACKGROUND

Field

Embodiments described herein relate to design-for-test architecture. More particularly, embodiments relate to design-for-test architectures for micro LED displays.

Background Information

Micro light emitting diode (LED), also known as μLED, is an emerging flat panel display technology. The μLED-based display panel includes arrays of microscopic LEDs forming the individual pixel elements. Compared with conventional LCD technology, μLED may offer advantages of greater contrast, faster response time, and less energy consumption. These advantages make μLED-based display panels suitable for small and low-energy portable or wearable devices. Local arrays of the μLEDs may each be driven by a corresponding pixel driver chip, which may also have microscopic dimensions on the order of the μLEDs to several pixel groups. Testing may be performed on the pixel driver ships to qualify the manufacturing and assembly process of the display panels.

SUMMARY

Design-for-test comparison circuits and scan chains are described. In particular, specific embodiments are described with regard to testing of μLED-based display panels including arrays of identical pixel driver chips. However, it is appreciated that embodiments may be applicable other arrangements of a variety of identical circuits and micro chips.

In an embodiment, a comparison circuit (which may be located on a timing controller chip) includes a plurality of scan-data out (SDO) inputs (e.g. into a corresponding plurality of pipelined flip-flops), and a corresponding plurality of comparators (e.g. XOR gates) to compare SDO data streams from the plurality of SDO inputs (or also downstream along the pipelined flip-flops) with an expected data stream. Each comparator is to transmit a compared data stream indicative of whether or not an error exists in any of the SDO data streams of the SDO inputs (e.g. along the pipelined flip-flops). The comparison circuit may further include a corresponding plurality of sticky registers (e.g. sticky flip-flops) coupled to the plurality of comparators, each sticky register to store a value indicative if an error is present in the compared data stream, and a scan-chain register (e.g. positive flip-flops) to store values from the corresponding plurality of sticky registers. For example, values of "1" may indicate an error detected, with values of "0" indicative of no error detected.

A method of testing an array of micro chips (e.g. pixel driver chips) in accordance with embodiments may include, broadcasting a plurality of cycles of scan-data in (SDI) to all micro chips in a row of micro chips, producing a scan-data out (SDO) data stream for each micro chip, comparing a downstream version of the SDO data stream for each micro chip with an expected data stream, storing values of the compared data streams, the stored values indicative if an error is present in the compared data streams, and shifting out the stored values.

Scan chains may exist in routing and circuitry spanning the timing controller chip, display panel, and pixel driver chips. A pixel driver chip in particular, may include a portion of the scan-chain in which a clock gater is used to generate a pulse signal from a square waveform. In an embodiment, a scan chain includes a micro chip including a scan-data in (SDI) terminal, a chain of positive triggered flip-flops, including a first positive triggered flip-flop coupled to the SDI terminal, and a clock gater coupled to a last positive triggered flip-flop in the chain of positive triggered flip-flops to covert a logical 1 non-return-to-zero (NRZ) output Q1 from the last positive triggered flip-flop to a pulse (P) return-to-zero (RZ) output Q2 from the clock gater.

A method of testing a micro chip in accordance with embodiment may include broadcasting a plurality of cycles of scan-data in (SDI) to a micro chip, generating a square waveform output signal from a chain of positive triggered flip-flops, receiving the square waveform output signal with a clock gater in the micro chip, and transmitting a pulse P signal from the clock gater to a negative triggered flip-flop in a timing controller, and generating a square waveform output signal with the negative triggered flip-flop in the timing controller.

BRIEF DESCRIPTION OF THE DRAWINGS

FIG. 2A is a schematic diagram of a scan-broadcast mechanism in accordance with an embodiment.

FIG. 2B is a schematic diagram of a design-for-test control chain in accordance with an embodiment.

DETAILED DESCRIPTION

Embodiments describe design-for-test (DFT) architectures, and methods of testing an array of chips. Specifically, embodiments describe μLED-based display panels, and methods of testing an array of pixel driver chips and row driver chips. In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments. In addition, the phrase coupled to or coupled with may mean one element directly connected to another element, or connected in an electrical path than may have one or more intervening elements.

It has been observed that conventional DFT architectures cannot efficiently test μLED-based display panels including mainly identical pixel elements, which is different than regular CMOS circuit designs. Accordingly, embodiments describe specific DFT architectures that may be used with μLED-based display panels.

In one aspect, embodiment describe a test-response comparator in the DFT architecture for μLED-based display panels. The test-response comparator in accordance with embodiments may fully utilize the identicalness of pixel drivers and eliminate the need for analyzing outputs from every pixel driver. The signal for comparison can either be generated on the fly or be sent from DFT control logics. Masking designs may also be incorporated for debug purpose.

In another aspect, embodiments describe a scan-data transfer scheme in a design-for-test (DFT) architecture for a pixel driver-based display panel. The proposed scan-data transfer scheme may avoid a voltage drop over common scan-data out lines and reliably transfer data from the display panel to a DFT controller. Moreover, in order to simulate the invented scheme in an automatic test pattern generation (ATPG) tool, an ATPG model is described in accordance with embodiments for the clock gating cell. Simulation results verify ATPG can successfully generate a corrected pattern using the developed ATPG model.

Figure 1:
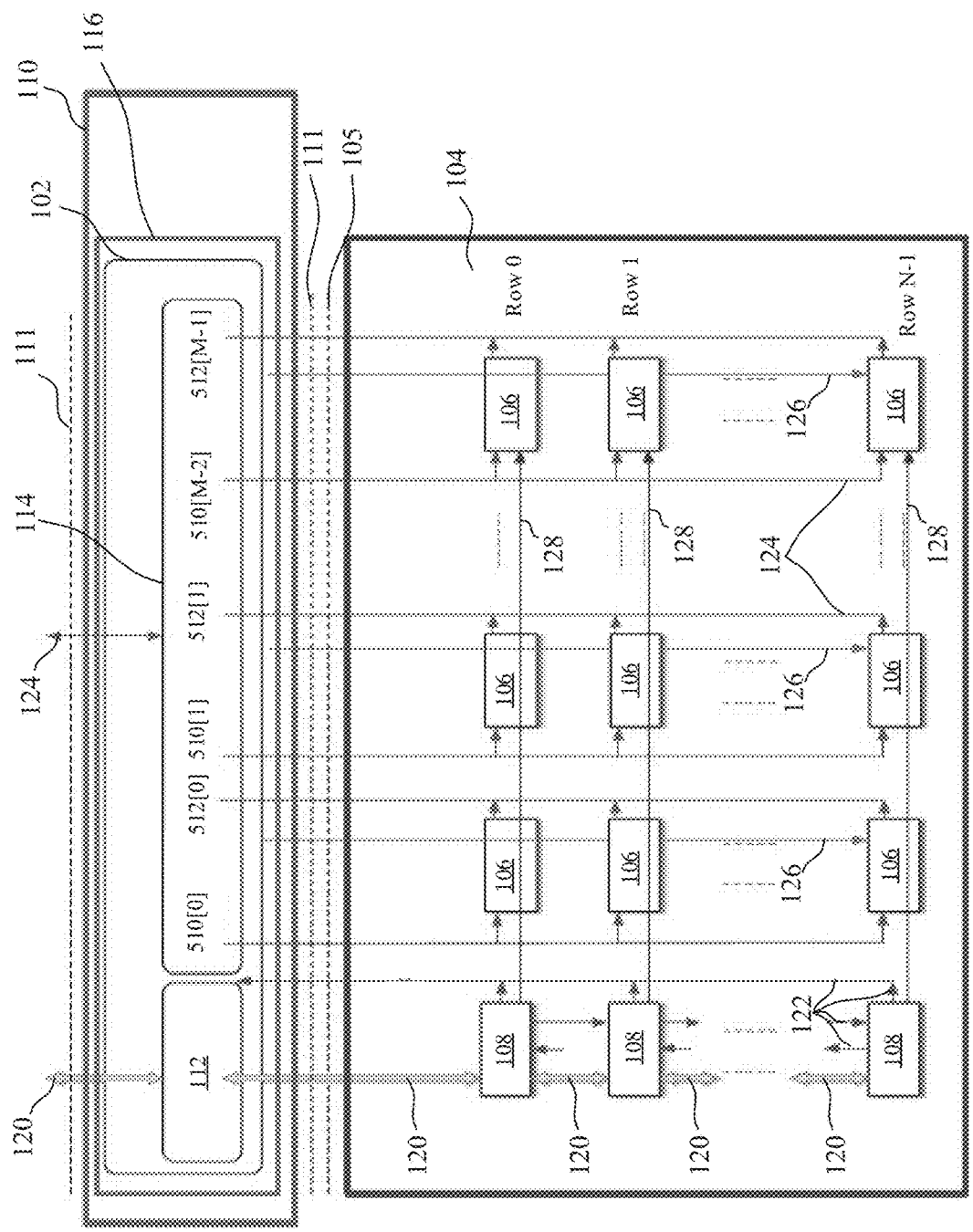
FIG. 1 is a schematic layout view of a DFT architecture in accordance with embodiment.

FIG. 1 is a schematic layout view of a DFT architecture in accordance with embodiment. Two major components illustrated in FIG. 1 include a DFT controller 102 and μLED-based display panel 104. The a DFT controller 102 and display panel 104 are separated by a timing controller (TCON) 110 chip boundary 111 and a display panel 104 boundary 105 in FIG. 1. The display panel 104 in FIG. 1 includes pixel drivers 106 and row drivers 108. In one implementation, there is no memory block inside the pixel drivers 106 and row drivers 108 and Joint Test Access Group (JTAG) and automatic test pattern generation (ATPG) scan test can provide the full coverage. The DFT controller 102 contains a JTAG controller 112 and a scan controller 114 in the TCON 110. The JTAG controller 112 may be a standard IEEE 1149 compatible controller, which can be used to program the row drivers 108. The scan controller 114 is also controlled by the JTAG controller 112.

In order to perform manufacturing and assembly testing on both chiplet silicon (pixel drivers and row drivers) and interconnections on the display pattern, DFT logic 116 (including the JTAG controller 112 and scan controller 114) is added on the TCON 110 chip, working as the test access mechanism (TAM) between the automated test equipment (ATE) and display panel 104. Both control signals and DFT signals can be loaded into each pixel driver 106. Since routing resource may be extremely constrained on the display panel 104, a functional data signal is reused as scan-data in (SDI) 510 input from the TCON 110. Moreover, the signal is broadcast to all pixel drivers 106 in the same column in order to further minimize the routing resources. Thus, functional data signals can be reused as scan inputs from TCON and broadcast to all pixel drivers 106 in the same column. In a row-by-row testing method, since the same signal is broadcast to all column, the same signal is broadcast to all pixel drivers in the same row as well.

Routing for the TCON 110 and display panel 104 is generally illustrated to include JTAG connections 120, row DFT connections 122, pixel driver 106 scan connections 124, vertical control signals 126, and horizontal control signals 128. In operation, the row drivers 108 may be first configured sending signals along the row DFT connections to turn on a specified row, or rows, and broadcast pixel driver configuration data across the horizontal control signal 128 lines to turn on the specified row of pixel drivers. Thus, all pixel drivers 106 in the same row may be tested at once, and receive the same signal.

The scan-data out from all pixel drivers in the same column share a common scan-data out (SDO) 512[ . . . ] bus to send the data back to the DFT controller in the TCON. The SDO 512[ . . . ] bus lines may be data lines, also illustrated as the pixel driver scan connections 124 (likewise, pixel driver scan connections 124 form the SDI 510[ . . . ] lines). In an embodiment in which the display panel has M×N pixel drivers (M and N represent the number of columns and rows, respectively), each SDO 512[ . . . ] bus is driven by N pixel drivers. Thus, there are N pixel driver outputs driving the same SDO 512[ . . . ] bus to transport signals back to DFT controller 102. N can range from several hundreds to even one thousand in different display applications. Therefore, embodiments describe a special test response comparator, since it may be infeasible to send such a large number of scan-out buses back to the DFT controller 102 and then to the ATE.

In order to reliably transport the data to the DFT control logic 116, the bus structure in accordance with embodiments may include structures for power protection and signal integrity. It has been observed that when multiple pixel driver 106 chiplets share a common tri-state buffer output, power open on one chiplet can drop common output to low. In an embodiment, protection to power open is implemented at tri-state buffer output. Secondly, it is possible that the last chiplet in a column could be a few centimeters away from a scan pipeline flip-flop in the TCON 110. In an embodiment, structures to maintain signal integrity are implemented.

In order to address the concerns of power open and signal integrity, embodiments incorporate a scan-data transfer scheme into the DFT architecture. In an embodiment, the "DATA" pin on a pixel driver is also used for scan-data in 510 input, and flip-flops in a scan chain are all positive triggered flip-flops. In order to avoid timing conflicts, the last pipelined flip-flop in the TCON 110 driving output is a negative flip-flop (see 330, FIG. 4A) forming a half cycle path from TCON to the display panel.

In accordance with embodiments, there may be tens to hundreds of rows, for example, on a display panel 104. As illustrated in FIG. 2A, a single DFT scan-in data signal 510 is broadcast to scan-in ports for all columns (see 510[0] to 510[M−1]), with M being the number of columns. As all pixel drivers are identical there is no ATPG controllability conflict among different rows or columns. Therefore, such a broadcast mechanism does not compromise ATPG quality. Referring now to FIG. 2B, a dedicated DFT control chain is stitched between the scan-data-in (SDI) 510 and SDO 512 lines. In an embodiment, all flip-flops in the chain have a Q to D loopback, and they hold the constant value during the capture mode. These flip-flops can be loaded to be different logic values during the shift model.

Figures 3A, 3B:
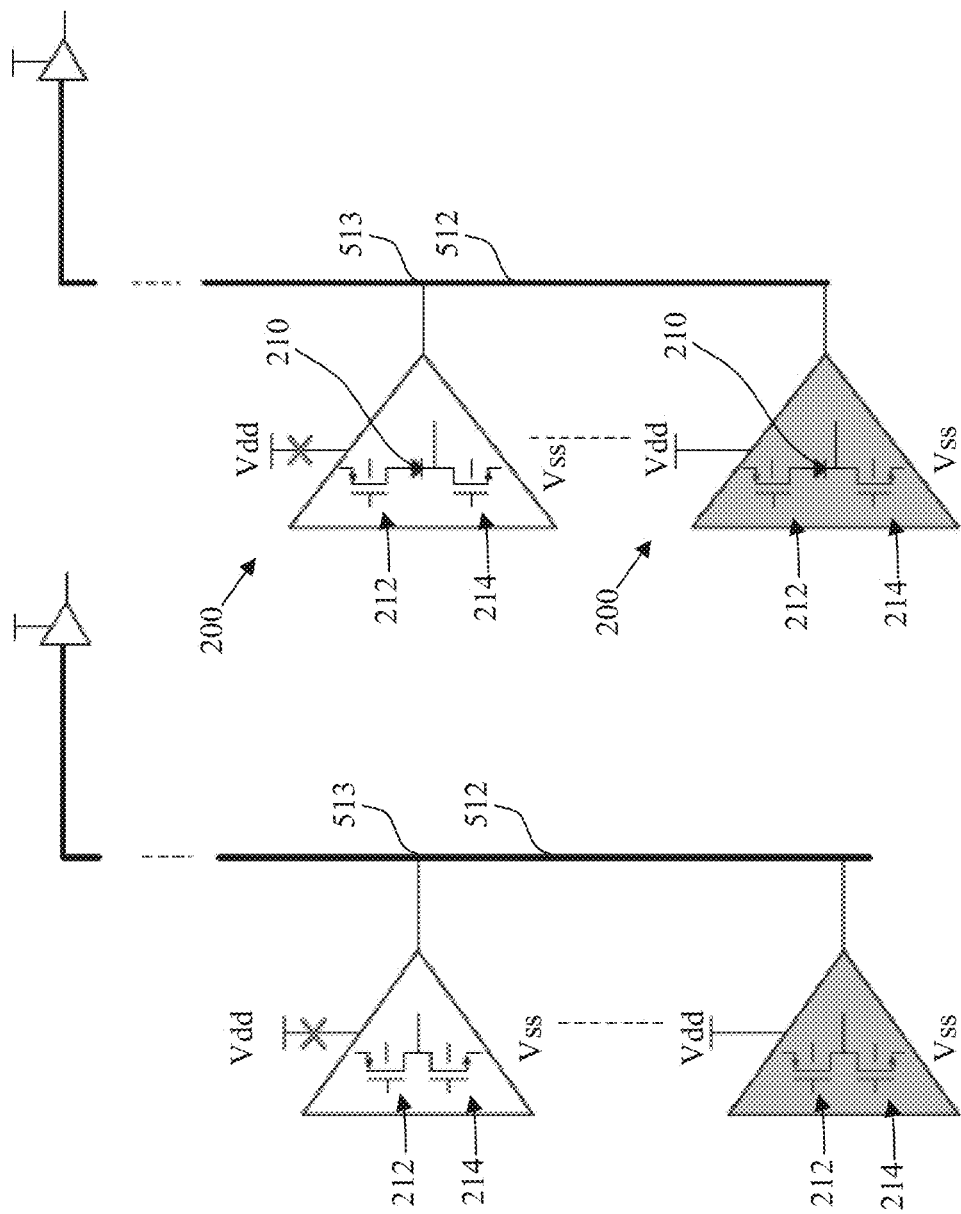
FIG. 3A is a circuit diagram of pixel drivers with a shared common tri-state buffer in accordance with an embodiment.
FIG. 3B is a circuit diagram of pixel drivers with a shared common tri-state buffer with a boot-strap NMOS design in accordance with an embodiment.

It has been observed that when multiple pixel drivers share a common tri-state buffer output, power open on one pixel driver can drop common output to low. Therefore, DFT can fail even with redundancy. An illustration is presented in FIG. 3A. Thus, in case of an open on one pixel driver 106, signal integrity for the entire column is degraded. In order to maintain the voltage value, a boot-strap NMOS design is implemented at the CMOS output of a pixel driver 106. In embodiment, a diode 210 is used to cut off the current draining path when power is open. The design in accordance with embodiments is presented in FIG. 3B, where a diode 210 is located between the PMOS transistor 212 and NMOS transistor 214 in the tri-state buffer 200. More specifically, the diode 210 is located between the drain of the PMOS transistor 212 and output to SDO 512 bus.

Due to the potential issue of open power, a non-compensated active pixel driver may not be able to drive the scan-data-out (SDO) 512 to consecutive logic is (logic 1 may drop to logic 0 at the end). In order to maintain the correct logic value, the output SDO 510 is "refreshed" during every shift cycle. In accordance with embodiments, a clock gater 310 is inserted in the shift path 300 to covert logic 1 non-return-to-zero (NRZ) output Q1 to pulse (P) return-to-zero (RZ) output Q2. The RZ signals can then be converted back to NRZ signals in the TCON and finally be compared on the ATE. During the conversion procedure, logic 1 is first converted to a pulse and then converted back to logic 1. Therefore, the voltage drop can be effectively avoided.

Figure 4A:
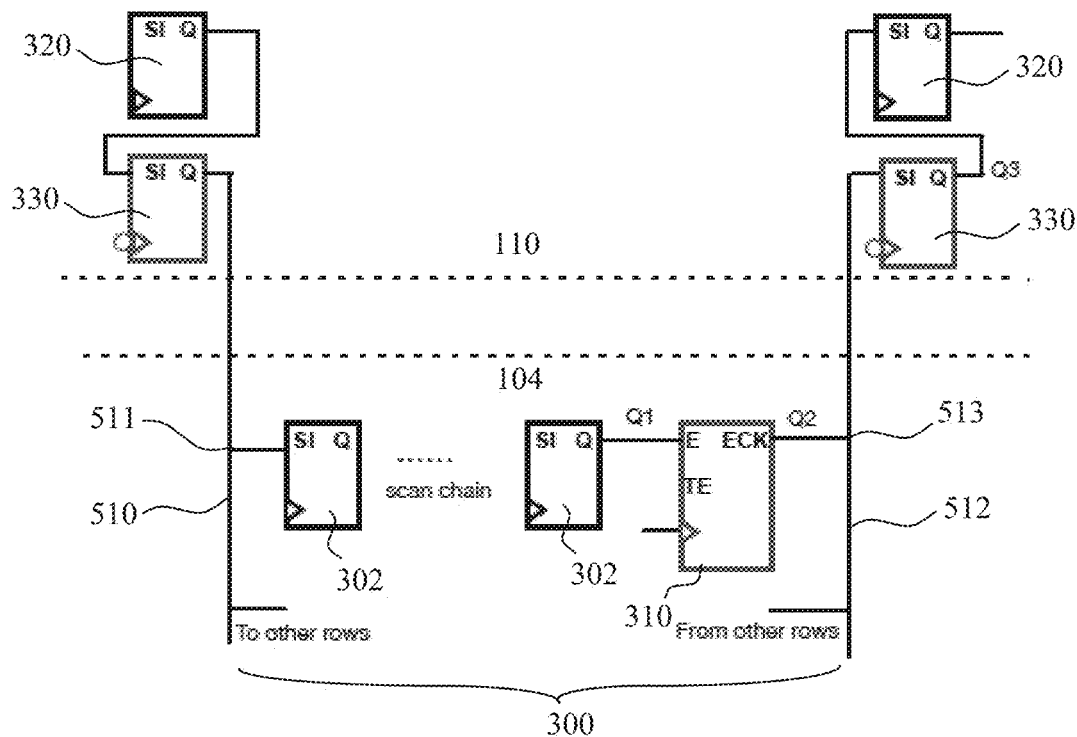
FIG. 4A is a circuit diagram of a scan-chain connection between a pixel driver and TCON in accordance with an embodiment.

Referring now to FIG. 4A, an illustration is provided of the scan-chain connection between a pixel driver 106 and TCON 110. As shown in the scan-chain, piplelined positive triggered flip-flops 320 and negative triggered flip-flops 330 are located an SDI 510 output terminals of the TCON 110 chip, and SDO 512 input terminals of the TCON 110 chip. SDI 510 and SDO 512 routing on the display panel 104 may be through routing of the pixel driver scan connections 124, to terminals on the pixel driver 106 chips as SDI and SDO input and output terminals 511, 513, respectively. The shift path 300 within a pixel driver 106 chip may include a chain of positive triggered flip-flops 302, including a first positive triggered flip-flop 320 coupled to the SDI 510 terminal. A clock gater 320 is coupled to a last positive triggered flip-flop 300 in the chain of positive triggered flip-flops 302 to covert logical 1 non-return-to-zero (NRZ) output Q1 from the last positive triggered flip-flop to a pulse (P) return-to-zero (RZ) output Q2 from the clock gater 320. Simplified illustrations of the positive triggered flip-flops 302 are provided to show the scan input (SI), output (Q), and scan clock (triangle). Simplified clock gater 310 illustration includes enable (E), test enable (TE), enable clock (ECK), and scan clock (triangle). As shown, the output Q1 is fed to the enable (E) input of the clock gater 310.

As shown, the flip-flops 330 in the scan-chain are negatively triggered, and the clock gater 310 is inserted in the shift path between the last flip-flop 302 and the SDO 512 (data line). Referring back to FIG. 3B, the tri-state buffer 200 can be inserted between the clock gater 310 and SDO 512. For example, output Q2 from the clock gater 310 may be coupled to one or both of the gates of the PMOS transistor 212 and NMOS transistor 214.

However, it has been observed that ATPG does not exactly model the clock gating cells during the test simulation. In accordance with embodiments, an ATPG model is developed in which the NRZ to RZ conversion clock gater 310 is modeled as a positive triggered flip-flop 320; see FIG. 4B.

Figure 4B:
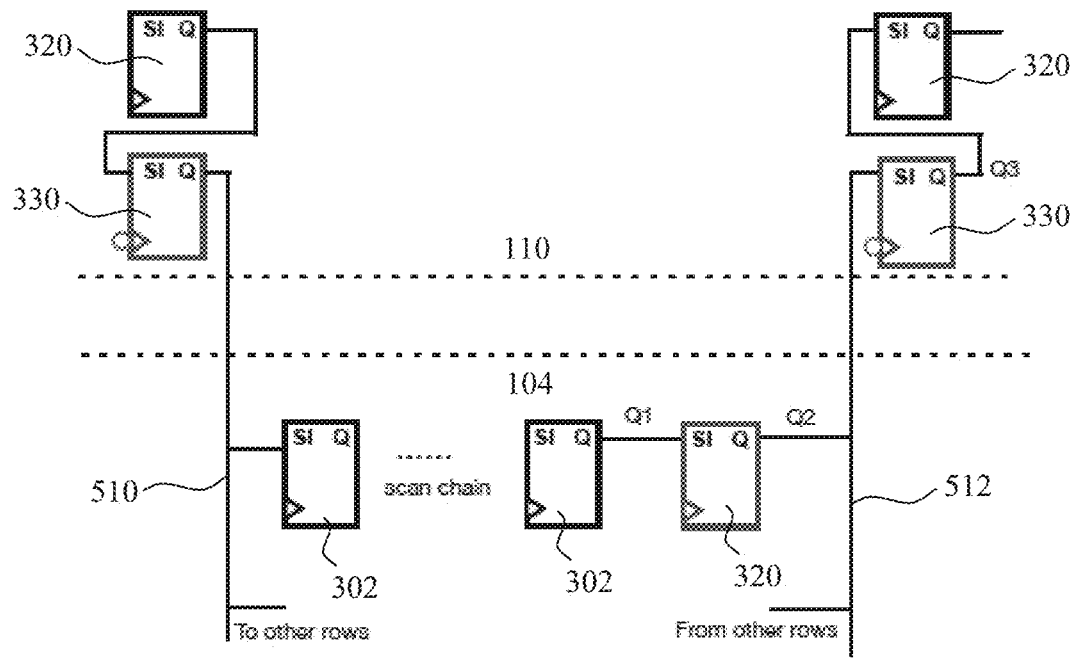
FIG. 4B is an automatic test pattern generation model of a scan-chain connection between a pixel driver and TCON in accordance with an embodiment.

As shown in FIGS. 4A-4B a negative flip-flop 330 in the TCON may be utilized to transfer the data from the clock gater 310 to TCON 110. Specifically, in the ATPG model, the artificial positive flip-flop 320 (gater) and negative pipeline flip-flop 330 (negatively triggered) form an "incorrect" chain order from ATPG capture prospective. Thus, the ATE tool sees the signal as a "1" though the signal is actually a pass "P." The capture value on these two cells are masked by default without extra handling.

Scan chains in accordance with embodiments may exist in routing and circuitry spanning the timing controller 110 chip, display panel 104, and pixel driver 106 chips. A pixel driver 106 chip in particular, may include a portion of the scan-chain in which a clock gater 310 is used to generate a pulse signal from a square waveform. In an embodiment, a scan chain includes a micro chip (e.g. pixel driver 106 chip) including a scan-data in (SDI) 510 terminal 511, a chain of positive triggered flip-flops 302, including a first positive triggered flip-flop coupled to the SDI terminal 511, and a clock gater 310 coupled to a last positive triggered flip-flop in the chain of positive triggered flip-flops to covert a logical 1 non-return-to-zero (NRZ) output Q1 from the last positive triggered flip-flop to a pulse (P) return-to-zero (RZ) output Q2 from the clock gater 310.

The scan chain may additionally include a tri-state buffer 200 coupling an output Q2 of the clock gater 310 to a scan-data out (SDO) 512 terminal 513. In an embodiment, the output Q2 from the clock gater 310 is coupled to a CMOS transistor gate (e.g. gate of either the PMOS transistor and/or NMOS transistor) in the tri-state buffer 200. In an embodiment, a diode 210 is connected between a PMOS transistor 212 and an NMOS transistor 214 in the tri-state buffer 200.

Figure 5:
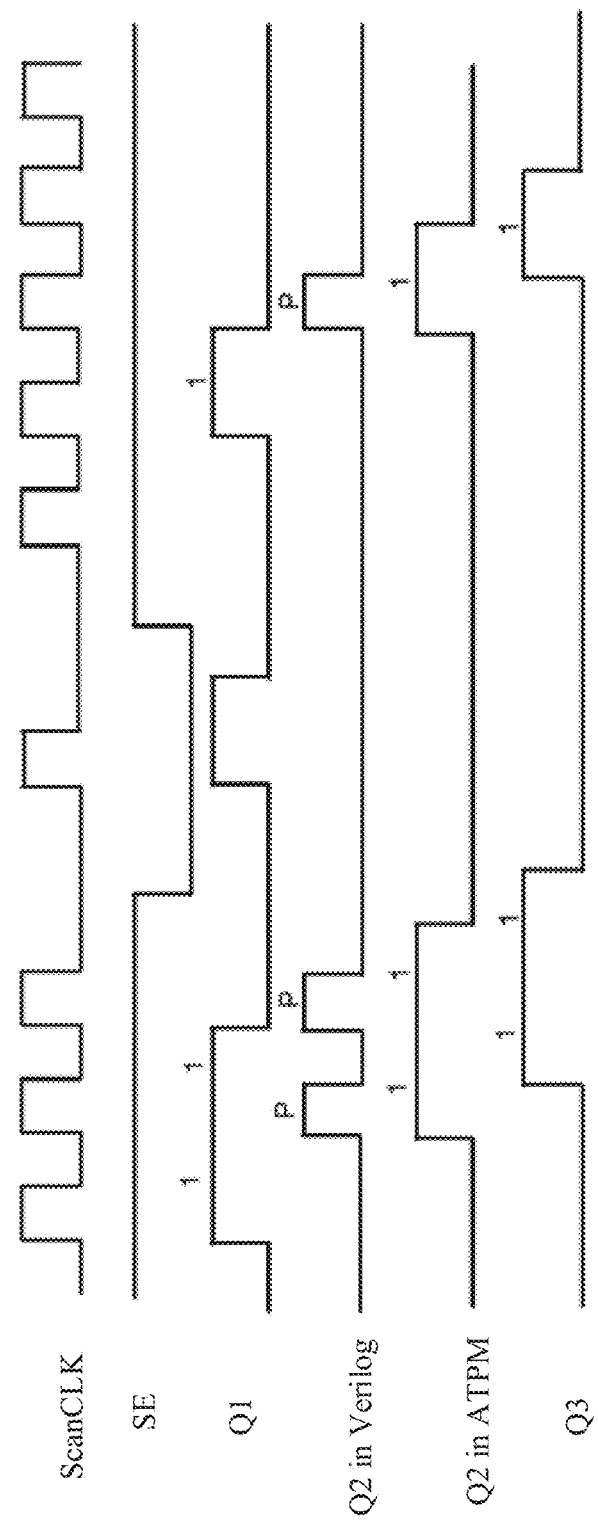
FIG. 5 is a timing diagram illustrating an ATPG model scan-data transfer scheme in accordance with an embodiment.

FIG. 5 is a timing diagram illustrating an ATPG model scan-data transfer scheme in accordance with an embodiment. Specifically, FIG. 5 illustrates the timing wave form on the SDO side. The parameter "ScanCLK", "SE", "Q1", "Q2", and "Q3" represent scan clock signals, scan-enable signals, output signal from Q1, output signal from Q2, and output signal from Q3, respectively. As shown, the shift data on Q3 is delayed by one and half cycle from Q1. This can be seen in both ATPG simulations, such as those sold under the trade name TetraMAX (RTM), and Verilog simulations, such as those sold under the trade name VCS (RTM). Q2 in ATPG is the artificial model to effectively fool the ATPG to generate the correct pattern. When such patterns are simulated in Verilog simulator, Q2 in is the expected waveform that exactly matches silicon data. Note that the automated test equipment (ATE) pattern can be simulated against real register transfer level or gate level model.

In an embodiment, a method of testing a micro chip (e.g. pixel driver 106 chip or row driver 108 chip) in accordance with embodiment may include broadcasting a plurality of cycles of scan-data in (SDI) 210 to a micro chip, generating a square waveform output signal (e.g. 0, 1) from a chain of positive triggered flip-flops 302, receiving the square waveform output signal with a clock gater 310 in the micro chip, and transmitting a pulse P signal from the clock gater 310 to a negative triggered flip-flop 330 in a timing controller 110, and generating a square waveform output signal with the negative triggered flip-flop 330 in the timing controller 110. In an embodiment, an automatic test pattern generation (ATPG) model is run in which the clock gater 310 is modeled as a positive triggered flip-flop 320.

Figure 6:
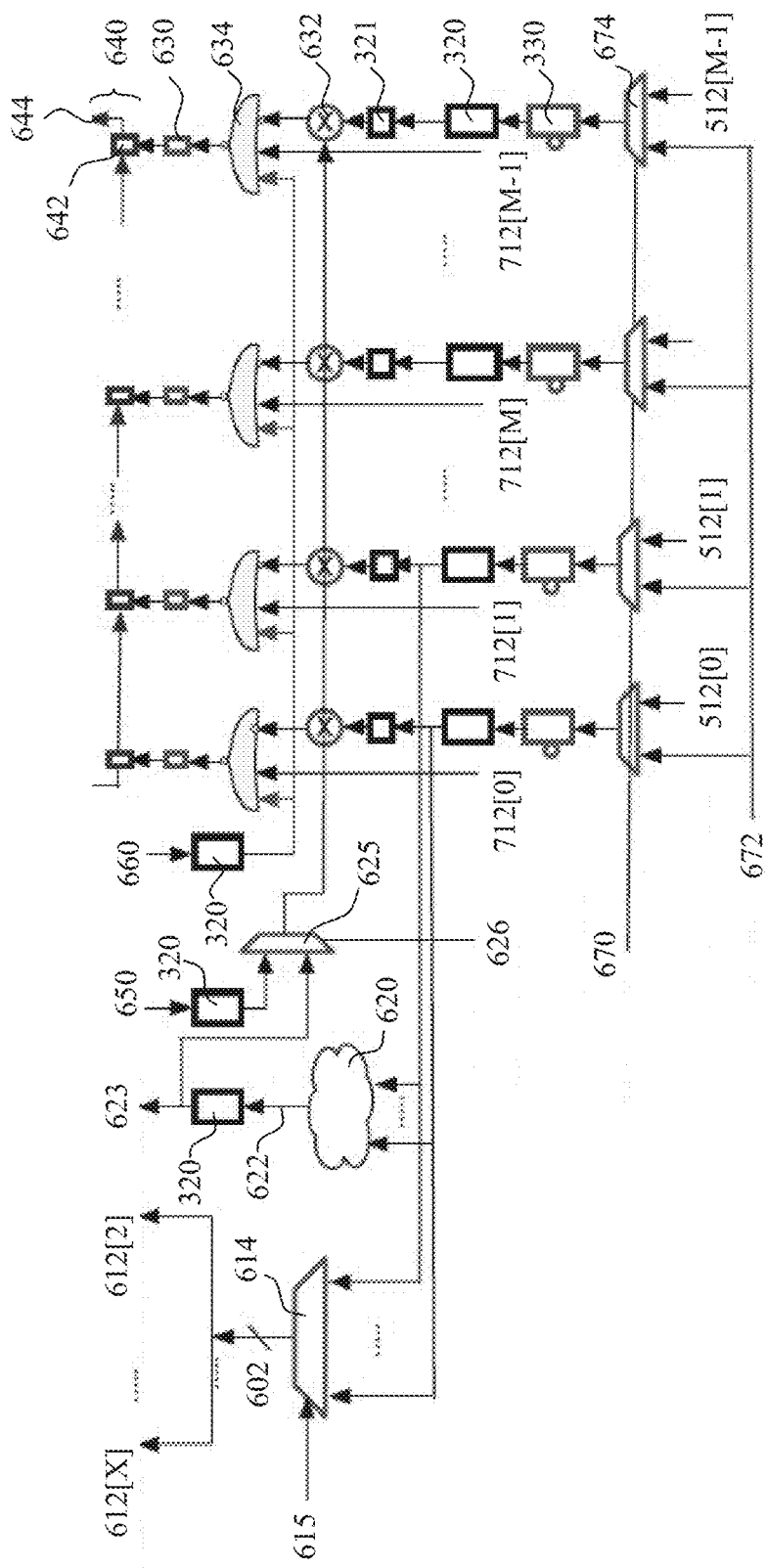
FIG. 6 is a circuit diagram of a test-response comparison circuit in accordance with an embodiment.

Referring now to FIG. 6, a circuit diagram is provided of a test-response comparison circuit in the TCON in accordance with embodiments, which may utilize the benefits of replicated pixel drivers rather than providing SDOs from all rows to the ATE. As shown, an observation bus 602, ranging from DFT SDO 612[2] to DFT SDO 612[X] may be used to observe SDOs 512[0] to 512[M−1] from all rows. Data from SDOs 510[0] to 512[M−1] is fed to multiplexer 614, with a JTAG observation select signal 615 to generate observation bus 602. With different JTAG programming, different subsets of columns of SDOs 512[0 . . . M−1] can be selected and observed on the observation bus 602. The multiplexer 614 size, and hence value of X for DFT SDO 612[X], is determined by a ratio of $M_r$ (the number of columns to be observed) and $M_{SO}$ (the number of available scanout pins). In an embodiment, the observation bus 602 is only used for debug purpose in a fall-back mode in case the developed test-response comparator cannot work properly. Thus, this section is optional, and may be utilized when the TCON has additional pins available for on the fly observation, and debug purposes.

Since pixel drivers are identical with each other, the fault-free responses for SDOs from all rows and columns should also be the same. In an embodiment, a plurality (e.g. three or more) of these SDOs 512 [0 . . . M−1] are selected and generate an expected value 622 data stream using a majority logic 620 on the fly. The generated expected value 622 data stream is stored in positive flip-flop 320, and may be read-out at scan-out 623, and sent to muliplexer 625 with JTAG select 626 input. The generated expected value 622 data stream output from the multiplexer 625 is XORed with each SDO 512 data stream, which may be provided from buffer 321. The XORed results are captured by sticky flip-flops 630. If a logic 1 is generated by an XOR gate 632, which indicates the corresponding SDO is faulty for the column, the logic 1 will be captured by a sticky flip-flop 630 and the output of the sticky flip-flop remains logic 1 during the entire scan-pattern loading stage. Thus, once set, the sticky flip-flop 630 value is fixed until a hard reset. After scan patterns have been completely loaded, a JTAG readout pattern is utilized to capture generated signatures, i.e., outputs from XOR gates 632, into a scan-chain register 640 of JTAG (positive) flip-flops 642. Finally, captured signatures in the scan-chain register 640 is shifted out at test data output 644. If there are logic is in shifted signatures, which indicates there are defects in some rows, corresponding rows will be selected and their SDOs 512 may be output to operation bus 602 for further analysis. In this way, fault diagnosis and physical failure analysis can be performed.

In another embodiment, instead of generating the expected value 622 on the fly using a majority logic 620, the expected value for comparison can also be sent from an expected value DTF scan-in 650 line from the DFT controller. For example, this feature may designed only for debug purpose where extra pins are not available for on the fly observation and debugging.

Still referring to FIG. 6, in accordance with embodiments the outputs from XOR gates 632 can be masked through OR gates 634 before they are captured by sticky registers 630 (e.g. flip flops). This may be specifically designed for debug purpose. In accordance with embodiments, two ways to mask the outputs may be global masking and column-specific masking. In both cases the output for masking may be a "0".

In a global masking implementation, a global masking signal can be sent from global DFT scan-in 660 to mask all SDOs 512 in specific cycles with mask data in the OR gates 634. A purpose of global masking may be to eliminate unknown values from analog modules and timing-exception paths, which can corrupt the sticky registers 630 (e.g. flip-flops). Thus "X" values are not scanned, and instead are masked as "0."

In a column-specific masking implementation, column-specific masking signals 712 [0 . . . M1] are from IEEE 1500, and these signals can permanently mask corresponding columns. The column-specific masking can be used in following two situations: (i) some SDOs are not used or even not driven by the control panel, therefore, these column should be masked; (ii) some specific column are required to be masked in the debug mode.

The scan chains can be bypassed by setting a JTAG bit (e.g. panel scan chain DFT scan chain bypass 670). In the bypass mode, the signal pipelined DFT scan-in 672 is looped back in TCON, which helps to debug connection issues between TCON and the display panel.

Figure 7:
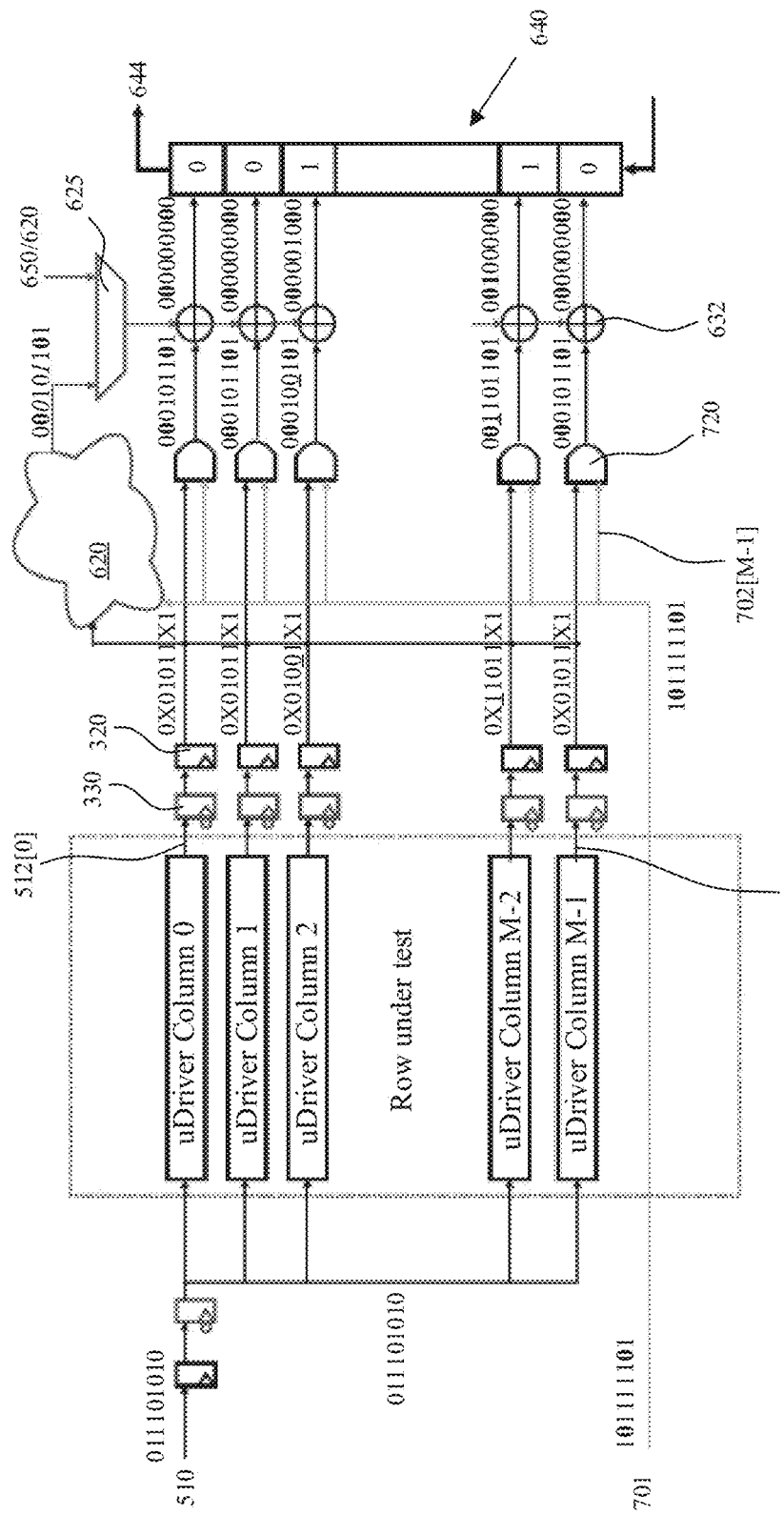
FIG. 7 a schematic flow diagram for an exemplary data stream of a row under test in accordance with an embodiment.

Referring now to FIG. 7 a schematic flow diagram is provided for an exemplary data stream of a row under test in accordance with an embodiment. In this embodiment, a different masking mechanism is included where specific bits of a data stream are masked, as opposed to entire columns. The masking of FIG. 7 is compatible with the masking of FIG. 6, and may be combined. In the provided example, row 2 of the panel is being tested. Each row has M columns of pixel drivers, with each pixel driver 0 to M−1 being identical. In the example, it is understood that the pixel drivers in columns 2 and M−2 are defective, and will produce an erroneous response to stimuli. In the exemplary embodiment, 9 cycles of test are applied to the pixel drivers under test in row 2.

Figure 8:
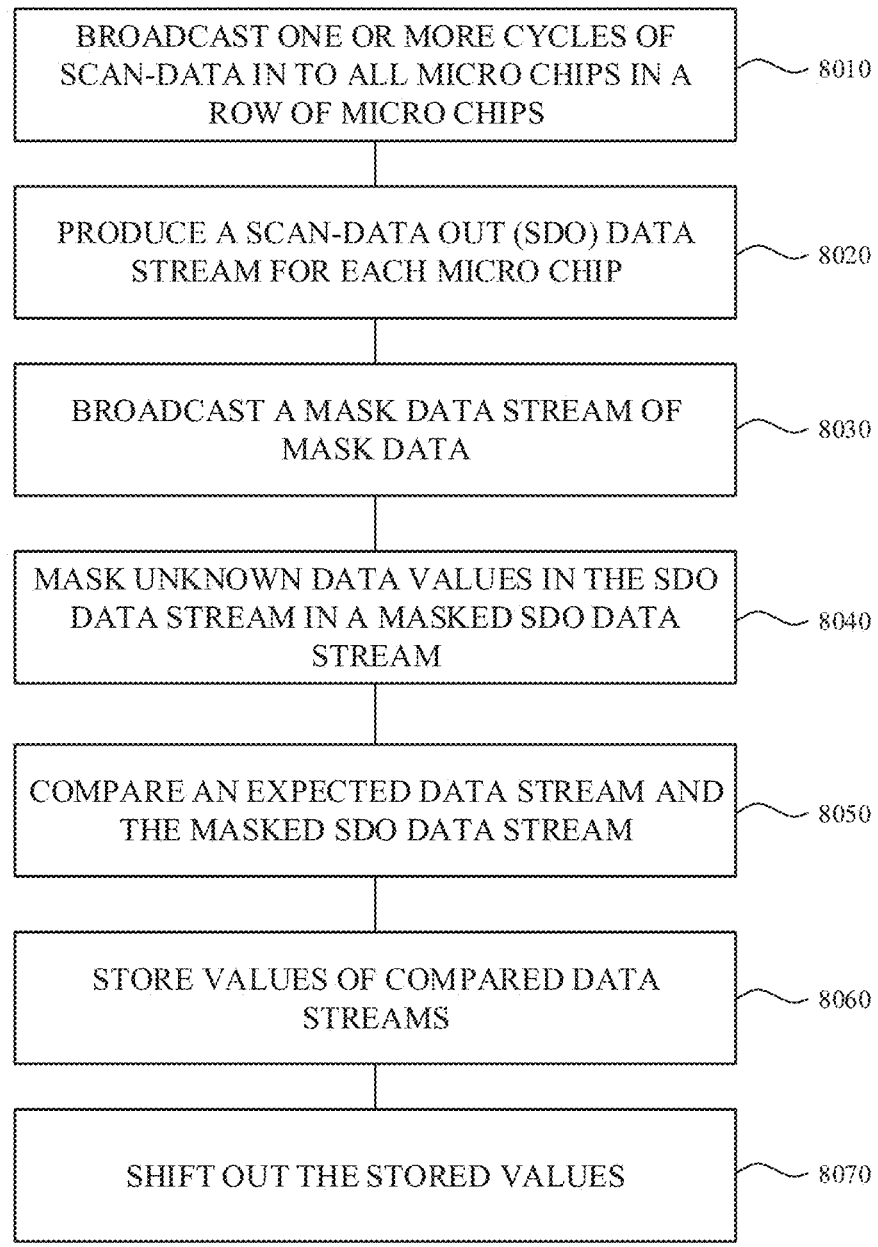
FIG. 8 is a flow chart of a test cycle in accordance with an embodiment.

FIG. 8 is a flow chart of a test cycle in accordance with an embodiment. In interest of clarity, the general process flow provided in FIG. 8 is described in combination with the specific example of FIG. 7. At operation 8010 one of more cycles of scan-data in (SDI) 510 are broadcast to all pixel drivers in a targeted row. For example, the cycles of data may be broadcast from a single scan-in 510 pin on the TCON 110 chip, and repeated to all scan-in columns 510 [0]-510[M−1] as shown in FIG. 5A. In the illustrative example, the scan-in data stream is (011101010).

At operation 8020 the pixel drivers produce a response. For example, the defect-free pixel drivers produce the scan-data out (SDO) 512[ . . . ] data stream (0X01011X1), where X denotes an unknown value due to circuit design restraints. The defective pixel drivers in columns 2 and M−2 produce an erroneous value in SDO 512[2] data stream (0X010 0̲1X1) and 512[M−2] data stream (0X1̲1011X1), respectively, to the stimulus, with the erroneous value indicated with underlining. At operation 8030 a mask data stream of mask data 702 is generated to mask the unknown values within the SDO 512[2] and 512[M−2] data streams. The mask data may be used, for example, if the response comparator circuits cannot handle unknown responses. Thus a mask data stream of mask data 702, with the same number of cycles as the SDI 510 is applied from the mask data scan-in pin 702 of the TCON 110 chip. As shown, the SDO 512[ . . . ] and mask data 702 from mask data scan-in pin 701 are input into the majority logic 620, and mask AND gates 720. At operation 8040 the mask AND gates 720 output low data values "0" for the unknown values in the error free data stream, as indicated in bold font. Thus, the masked SDO data stream (0X01001X1) for downstream SDO 512[2] is output from mask AND gate 720 as (000100101) and the masked SDO data stream (0X11011X1) for SDO 512[M−2] is output from mask AND gate 720 as (001101101).

At operation 8050 an expected data stream is compared with the masked SDO data stream.

The expected data stream can be obtained from a variety of places in accordance with embodiments. For example, the expected data stream can be from an expected value DTF scan-in 650 line, or the expected data stream can be generated with majority logic 620 as previously described. In an embodiment, the majority logic 620 polls the M columns to generate majority data stream that is most recurring across the M columns for every cycle. The majority data stream is used as the expected data stream. In the illustrated example, the majority data stream will be (000101101). In this example, the italicized notations denote where any for the columns deviate from the majority data stream (columns 2 and M−2 for cycles 3 and 6).

As illustrated, the expected data stream (e.g. from expected value DTF scan-in 650 line or the majority logic 620) is fed into the XOR gates 632, whose other input are the post mask AND gate 720 data streams from each of the M columns. The XOR gates will generate 0 in case of any error free response, and a 1 in case the response of the pixel driver has deviated from the expected value. In this case the XOR gates 632 output post-XOR data streams with the same number of cycles as the scan-in data. Thus, the XOR data streams for columns 2 and M−2 become (000001000) and (001000000), respectively. At operation 8060 the post-XOR data streams are fed into a scan-chain register 640 (e.g. sticky signature analyzer) that stores the signature values of each column of the comparator over time (all nine cycles). At operation 8070, the scan-chain register 640 is shifted out (as test data out, TDO 644) to get the results of all M columns of pixel drivers in row 2.

Referring again to FIGS. 6-8, in an embodiment, a comparison circuit (which may be located on a timing controller chip) includes a plurality of scan-data out (SDO) 512[0 . . . M−1] inputs (e.g. into a corresponding plurality of pipelined flip-flops (e.g. 330, 320)), and a corresponding plurality of comparators (e.g. XOR gates 632) to compare SDO data streams from the plurality of SDO inputs (or from the pipelined flip-flops) with an expected data stream (e.g. from majority logic circuit 620 or expected value DTF scan-in 650 line). Each comparator is to transmit a compared data stream indicative of whether or not an error exists in any of the SDO data streams of the SDO inputs (e.g. downstream along the pipelined flip-flops). The comparison circuit may further include a corresponding plurality of sticky registers (e.g. sticky flip-flops 630) coupled to the plurality of comparators, each sticky register to store a value indicative if an error is present in the compared data stream, and a scan-chain register (e.g. positive flip-flops 642) to store values from the corresponding plurality of sticky registers. For example, values of "1" may indicate an error detected, with values of "0" indicative of no error detected. In a specific implementation, the comparison circuit can additionally include a display panel 104 coupled with the plurality of scan-data out (SDO) 510[0 . . . M−1] inputs, the display panel including a corresponding plurality of columns M of identical pixel driver 106 chips.

The expected data stream may be generated on the fly or sent from the DFT control logic 116. In an embodiment, the comparison circuit includes a logic circuit (e.g. majority logic 620) coupled with SDO inputs (or downstream, along outputs of the plurality of pipelined flip-flops (e.g. 330, 320)) to generate the expected data stream, an output of the logic circuit coupled with the plurality of comparators (e.g. XOR gates 632). In such an embodiment, the expected data stream may be generated on the fly. The comparison circuit may additionally include a multiplexer 625 between the output of the logic circuit and the plurality of comparators. An expected value design-for-test scan-in line 650 may be coupled to an input of the multiplexer 625, along with a select input 626 to the multiplexer 625 to select one of the output of the logic circuit (e.g. generated on the fly) and the expected value design-for-test scan-in line (e.g. sent from the DFT control logic 116). In other embodiments, where on the fly generation is not implemented, the logic circuit and related connections are not present, and the multiplexer is likewise optional.

Various masking implementations may be included, alternatively, or in combination with one another. In on embodiment, the comparison circuit includes a corresponding plurality of OR gates 634 between the plurality of comparators (e.g. XOR gates 632) and the plurality of sticky registers (e.g. stick flops 630), a mask input into each OR gate 634. For example, the mask inputs may be global (e.g. from global DFT scan-in 660) or column-specific masking signals 712 [0 . . . M1]. The mask data may also be data specific to the SDO data streams. In an embodiment, the comparison circuit includes a corresponding plurality of AND gates 720 between the plurality of SDO inputs (or pipelined flip-flops (e.g. 330, 320)) and the plurality of comparators (e.g. XOR gates 632), a mask input 702[0 . . . M−1] into each AND gate 720.

Additional circuitry may be implemented for debug. In an embodiment, the comparison circuit additionally includes a plurality of multiplexer 614 inputs coupled to the plurality of SDO inputs (e.g. downstream after the pipelined flip-flops (e.g. 330, 320)), a select signal 615 input to the multiplexer 614, an observation bus 602 coupled to an output of the multiplexer 614, and a plurality of design-for-test scan-data out terminals 612 [2 . . . X] coupled to the observation bus 602. In an embodiment, the plurality of design-for-test scan-data out terminals is less than the plurality of multiplexer inputs coupled to the plurality of SDO inputs (or pipelined flip-flops).

In an embodiment, a method of testing an array of micro chips (e.g. pixel driver 106 chips) in accordance with embodiments may include, broadcasting a plurality of cycles of scan-data in (SDI) 510 to all micro chips in a row of micro chips, producing a scan-data out (SDO) 512 data stream for each micro chip, comparing a downstream version of the SDO 512 data stream for each micro chip with an expected data stream, storing values of the compared data streams (e.g. in JTAG (positive) flip-flops 642 of a scan-chain register 640), with the stored values (e.g. 0, 1) indicative if an error is present in the compared data streams, and shifting out the stored values (e.g. at test data output 644).

In a specific implementation, the testing method includes comparing the downstream version of the SDO 512 data stream for each micro chip with the expected data stream in a corresponding plurality of XOR gates 632, sending outputs of the compared data streams to a corresponding plurality of sticky registers 630, and storing the values of the compared data streams from the plurality of sticky registers in a scan-chain register 640.

In a masking implementation, producing an SDO 512 data stream for each micro chip comprises producing one or more SDO data streams with an unknown value (e.g. X in FIG. 7), and further comprising broadcasting a mask data stream of mask data 702 to mask the unknown values within the one or more SDO data streams (e.g. with '0' values) in one or more masked SDO data streams. In one design, unknown values are masked in an AND gate 720 to generate the one or more masked SDO data streams, and comparing the downstream version of the SDO 512 data stream for each micro chip with the expected data stream comprises comparing the one or more masked SDO data streams with the expected data stream. Such a masked data stream is illustrated with a bold "0" between the AND gate 20 and XOR gate 632 in FIG. 7.

The expected data stream may be generated in different manners. In an embodiment the expected data stream is transmitted form a DFT controller (e.g. from expected value DTF scan-in 650 line). In an embodiment, a plurality of the SDO data streams 712[0 . . . M−1] are sampled, and the expected data stream is generated with a logic circuit (e.g. majority logic 620).

In utilizing the various aspects of the embodiments, it would become apparent to one skilled in the art that combinations or variations of the above embodiments are possible for forming a design-for-test architecture for μLED-based display panels. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A comparison circuit comprising:
   plurality of scan-data out (SDO) inputs;
   a corresponding plurality of comparators to compare SDO data streams from the plurality of SDO inputs with an expected data stream, each comparator to transmit a compared data stream indicative of whether or not an error exists in the any of the SDO data streams;
   a corresponding plurality of sticky registers coupled to the plurality of comparators, each sticky register to store a value indicative if an error is present in the compared data stream; and
   a scan-chain register to store values from the corresponding plurality of sticky registers.

2. The comparison circuit of claim 1, further comprising a display panel coupled with the plurality of scan-data out (SDO) inputs, the display panel including a corresponding plurality of columns of identical pixel driver chips.

3. The comparison circuit of claim 1, further comprising:
   a logic circuit coupled with the SDO inputs to generate the expected data stream; and
   an output of the logic circuit coupled with the plurality of comparators.

4. The comparison circuit of claim 3, further comprising:
   a multiplexer between the output of the logic circuit and the plurality of comparators;
   an expected value design-for-test scan-in line coupled to an input of the multiplexer; and
   a select input to the multiplexer to select one of the output of the logic circuit and the expected value design-for-test scan-in line.

5. The comparison circuit of claim 1, further comprising:
   a corresponding plurality of OR gates between the plurality of comparators and the plurality of sticky registers; and
   a mask input into each OR gate.

6. The comparison circuit of claim 1, further comprising:
   a corresponding plurality of AND gates between the plurality of SDO inputs and the plurality of comparators; and
   a mask input into each AND gate.

7. The comparison circuit of claim 1, further comprising:
   a multiplexer;
   a plurality of multiplexer inputs to the multiplexer, the plurality of multiplexer inputs coupled to the plurality of SDO inputs;
   a select signal input to the multiplexer;
   an observation bus coupled to an output of the multiplexer; and
   a plurality of design-for-test scan-data out terminals coupled to the observation bus, wherein the plurality of design-for-test scan-data out terminals is less than the plurality of multiplexer inputs coupled with the plurality of SDO inputs.

8. A method of testing an array of micro chips comprising:
   broadcasting a plurality of cycles of scan-data in (SDI) to all micro chips in a row of micro chips;
   producing a scan-data out (SDO) data stream for each micro chip;
   comparing a downstream version of the SDO data stream for each micro chip with an expected data stream;
   storing values of the compared data streams in a scan-chain register, the stored values indicative if an error is present in the compared data streams; and
   shifting out the stored values at a test data output of the scan-chain register.

9. The method of claim 8, wherein the producing an SDO data stream for each micro chip comprises producing one or more SDO data streams with an unknown value, and further comprising broadcasting a mask data stream of mask data to mask the unknown values within the one or more SDO data streams in one or more masked SDO data streams.

10. The method of claim 9, further comprising masking the unknown values in an AND gate to generate the one or more masked SDO data streams, wherein comparing the downstream version of the SDO data stream for each micro chip with the expected data stream comprises comparing the one or more masked SDO data streams with the expected data stream.

11. The method of claim 8, further comprising transmitting the expected data stream from a design-for-test controller.

12. The method of claim 8, further comprising sampling a plurality of the SDO data streams and generating the expected data stream with a logic circuit.

13. The method of claim 8, further comprising:
   comparing the downstream version of the SDO data stream for each micro chip with the expected data stream in a corresponding plurality of XOR gates;
   sending outputs of the compared data streams to a corresponding plurality of sticky registers; and
   storing the values of the compared data streams from the plurality of sticky registers in the scan-chain register.

14. A scan chain comprising:
a micro chip including:
    a scan-data in (SDI) terminal;
    a chain of positive triggered flip-flops, including a first positive triggered flip-flop coupled to the SDI terminal; and
    a clock gater coupled to a last positive triggered flip-flop in the chain of positive triggered flip-flops to covert a logical 1 non-return-to-zero (NRZ) output Q1 from the last positive triggered flip-flop to a pulse (P) return-to-zero (RZ) output Q2 from the clock gater.

15. The scan chain of claim 14, further comprising a tri-state buffer coupling an output Q2 of the clock gater to a scan-data out (SDO) terminal.

16. The scan chain of claim 14, wherein the output Q2 from the clock gater is coupled to a CMOS transistor gate in the tri-state buffer.

17. The scan chain of claim 16, further comprising a diode connected between a PMOS transistor and an NMOS transistor in the tri-state buffer.

18. A method of testing a micro chip comprising:
    broadcasting a plurality of cycles of scan-data in (SDI) to a micro chip,
    generating a square waveform output signal from a chain of positive triggered flip-flops;
    receiving the square waveform output signal with a clock gater in the micro chip, and transmitting a pulse P signal from the clock gater to a negative triggered flip-flop in a timing controller; and
    generating a square waveform output signal with the negative triggered flip-flop in the timing controller.

19. The method of claim 18, further comprising running an automatic test pattern generation (ATPG) model in which the clock gater is modeled as a positive triggered flip-flop.

* * * * *